United States Patent [19]

Meyer

[11] Patent Number: 5,534,783
[45] Date of Patent: Jul. 9, 1996

[54] METHOD FOR DETERMINING ANOMALIES IN A LINE WHICH IS TO BE INVESTIGATED

[75] Inventor: Stephan Meyer, Berlin, Germany

[73] Assignee: Siemens Aktiengesellschaft, München, Germany

[21] Appl. No.: 356,205

[22] PCT Filed: May 17, 1993

[86] PCT No.: PCT/DE93/00444

§ 371 Date: Dec. 19, 1994

§ 102(e) Date: Dec. 19, 1994

[87] PCT Pub. No.: WO94/00772

PCT Pub. Date: Jan. 6, 1994

[30] Foreign Application Priority Data

Jun. 19, 1992 [DE] Germany .................... 42 20 409.7

[51] Int. Cl.⁶ ............................................. G01R 31/11
[52] U.S. Cl. ............................ 324/533; 324/532; 324/534; 324/535
[58] Field of Search .................... 324/527, 532, 324/533, 534, 535, 543

[56] References Cited

U.S. PATENT DOCUMENTS

| | | | |
|---|---|---|---|
| 3,693,080 | 9/1972 | Ross et al. ................ | 324/638 |
| 4,797,621 | 1/1989 | Anderson et al. ........... | 324/533 |
| 5,083,086 | 1/1992 | Steiner .................... | 324/533 |
| 5,155,439 | 10/1992 | Holmbo et al. ............ | 324/534 |
| 5,272,439 | 12/1993 | Mashikian et al. ......... | 324/527 X |
| 5,352,984 | 10/1994 | Piesinger ................. | 324/532 |

FOREIGN PATENT DOCUMENTS

| | | |
|---|---|---|
| 0433020 | 6/1991 | European Pat. Off. . |
| 1233488 | 2/1967 | Germany . |
| 3919497 | 12/1990 | Germany . |

OTHER PUBLICATIONS

Cables Et Transmission, vol. 29, No. 2, Apr. 1975, Paris, France, pp. 225–238, Fenouillet et al.: *Transimetre Pour Paires Coaxiales a Large Bande de Frequences.*
IEE Int. Symp. on El. Mag. Compatibility, 4 Aug. 1988, Seattle, USA, pp. 1–5, Kortstock: *Power Reflection Techniques in Susceptibility Tests . . . .*
ISSLS, International Symposium on Subscribers Loops and Services, 5 Oct. 1984, Nice, pp. 227–232, Lassaux et al.: *Echometre Numerique Pour Localiser Les Derangement.*
VDI–Z. 98 (1956), No. 13, pp. 600–604; Meyer-Eppler, W.: *Die technische Anwendung moderner Korrelationsverfahren.*

*Primary Examiner*—Kenneth A. Wieder
*Assistant Examiner*—Glenn W. Brown
*Attorney, Agent, or Firm*—Kenyon & Kenyon

[57] ABSTRACT

A method for determining anomalies in a line which is to be investigated detects a signal reflected from the line when a signal in the form of a pulse is applied to the line. In order to be able to carry out this method particularly quickly and with high accuracy, a weighting function is formed having a time profile that is characteristic of the response of a line which is of the same type as the line to be investigated, when it is acted on in the form of a pulse. The line which is in each case to be investigated has a single pulse applied to it as an application in the form of a pulse, and the detected, reflected signal is weighted with the weighting function in a convolution operation.

21 Claims, 5 Drawing Sheets

METHOD FOR DETERMINING ANOMALIES IN A LINE WHICH IS TO BE INVESTIGATED

BACKGROUND OF THE INVENTION

The present invention relates generally to methods for determining anomalies in a line which is to be investigated, and more particularly to a method for determining anomalies in a line which is to be investigated in which a signal in the form of a pulse is applied to the line at one end, and a signal which is reflected in the line is detected at the same end of the line.

EP 0 433 020 A2 discloses a method of this type, in which each point of the reflected signal is sampled several times and an average value is formed to improve the accuracy of the method, preferably to avoid noise influences. In order to reduce the number of sample values to be taken into account in this case while increasing the measurement speed, the system noise on the one hand and the optical noise on the other hand are determined, for example on an optical line, before the start of the measurement; the variables determined for this purpose are fixed. After this, while carrying out the known method, the respective sample value is detected successively several times, the average value is formed, and the noise element in the result is calculated. If it is found that the noise was less than the predicted value (previously measured), then the sampling of this sample value is then set, and further evaluations are carried out to confirm whether the determined measurement allows an anomaly to be deduced in the optical line which is to be investigated.

Furthermore, DE-A-12 33 488 discloses an arrangement which operates in accordance with the pulse-reflection method for the determination of fault points or inhomogeneity points in an electrical line in the case of which an arrangement with a two-channel amplifier circuit is used for equalization of the reflected pulses in order to achieve exact measurement results taking into account the frequency-dependent attenuation properties of the electrical line which is in each case to be investigated. The amplifier circuit is arranged upstream of a bridge circuit, via a differential amplifier, which bridge circuit contains the electrical line to be investigated in one bridge arm and a line simulation in a further bridge arm; further bridge arms have non-reactive resistors. The bridge circuit results in only the reflected pulses being detected on the output diagonal by the differential amplifier, and being passed on to the equalizing amplifier circuit, when test pulses are applied to the input diagonal. Pulses which allow a reliable deduction to be made on the magnitude and range of a fault on the electrical line which is to be investigated are produced at the output of the amplifier circuit, which is of relatively complex construction.

The present invention is directed to the problem of developing a method for determining anomalies in a line which is to be investigated, in which the measurement result can be achieved with high accuracy and in a relatively short period of time.

SUMMARY OF THE INVENTION

The present invention solves this problem by: (1) forming a weighting function with a time profile that is characteristic of the response of a line of the same type as the line to be investigated when acted on by a pulse signal; (2) applying a single pulse signal to the line which is to be investigated; and subsequently, (3) convolving the detected, reflected signal with the weighting function.

In this case, the term "a single pulse" is also understood in the context of the present invention to mean a pulse sequence which is used, for technical reasons, in the context of so-called multi-period sampling, to detect sample values which follow one another at very short time intervals.

The major advantage of the method of the present invention is that, to determine anomalies in a line which is to be investigated, only a single pulse need be applied to the line and only one series of sample values need be recorded. Since, specifically—to investigate lines of the same type—on the one hand a weighting function is formed having a time profile which is characteristic of the response of a line of this type when a pulse is applied to it, weighting which allows accurate determination of any existing anomalies can be carried out just by means of the reflected signal which is detected in response to a transmitted pulse, by a convolution operation using the weighting function. Admittedly, in the case of the method according to the present invention, the weighting function of a line of the same type must be determined and fixed on a line to be investigated before the start of the measurement; this determination is, however, required only on this one occasion for all the lines of the same type to be investigated subsequently. After this preparatory work, the method according to the present invention can then be carried out relatively quickly with high accuracy.

The weighting function has major significance when carrying out the method according to the present invention and governs the accuracy when determining anomalies on the line which is to be investigated. In the context of carrying out the method according to the present invention, it has been found to be advantageous if the weighting function is formed taking into account the various rise times of the detected, reflected pulses which are produced because of anomalies located at different points on the line of the same type. Specifically, it has been found that the pulse response of an incorrectly terminated line is dependent on the range of the incorrect termination from the end of the line at which the signal is applied. The range of the incorrect termination is proportional to the recording time, that is to say the time which elapses between the time when the signal is applied and reception of the reflected signal. A non-stationary behavior can thus be assumed. The frequency spectrum of possible pulse responses is limited with increasing time. This means that the range of an incorrect termination of a line which is to be investigated is expressed in the different rise time of the pulse response. The rise time of a detected, reflected pulse thus becomes larger and larger as the length grows and is, for example in the case of a balanced line with a length of 20 meters (incorrect termination at 20 m), for example approximately 16 ns and approximately 60 ns in the case of a 100 meter length. If, accordingly, the weighting function is formed taking into account the various rise times, then a profile of the weighted, reflected signal over time can be obtained by means of a convolution operation of the detected, reflected signal with the weighting function, which response allows precise statements to be made on the presence of anomalies on a line which is to be investigated.

In the context of the method according to the present invention, the weighting function can also be formed in an advantageous manner taking into account the various peak values of the detected, reflected pulses which are produced because of anomalies located at different points on the line of the same type. This is based on the fact that the peak values of the detected, reflected pulses also reduce with increasing range of an incorrect termination from that end to which pulses are applied of the line which is to be investigated.

In order to be able to carry out the method according to the present invention at as low a cost as possible and particularly quickly, it is regarded as being advantageous if the reflected signal is sampled and the sample values obtained in this case are stored with their time relationship being maintained; a weighting function is used which produces a constant or different weighting of the sample values over a different number of sample values which in each case follow one another in time. In the case of a type of method according to the present invention having a constant weighting, weighted sample values $Y_i$ are advantageously formed in accordance with the relationship $$Y_i = \frac{1}{N_{max}} \cdot \Sigma x(i-n) \text{ where } n=1 \ldots N_{max} \text{ and } N_{max} = tr \quad (1)$$

$N_{max}$ designating the number of sample values used for the respective averaging, n designating a sequential index, x(i-n) designating the unweighted sample values to be taken into account in each case, and tr designating the rise time.

In the case of a method of the present invention using a different weighting, the weighting can be carried out, for example, in accordance with the weighting function of an RC element.

Instead of the digital filtering (weighting) dealt with above, the weighting of the detected, reflected signal in the context of the method according to the present invention can also be carried out by means of an analog filter, to which the signal is fed on the input side. The advantages are the comparatively fast speed and the wide bandwidth.

DETAILED DESCRIPTION

Figure 1:
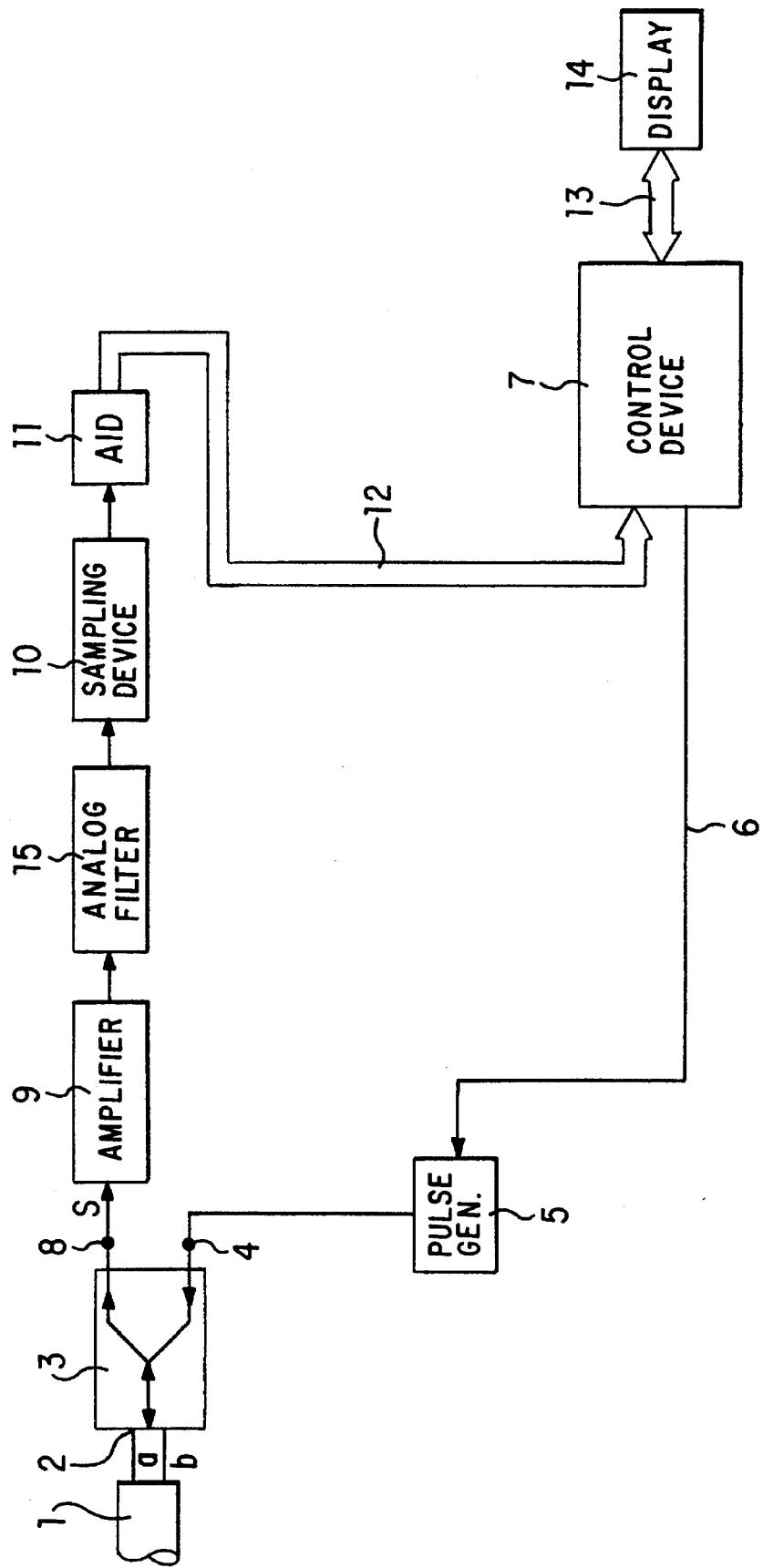
FIG. 1 depicts a block diagram of an apparatus for carrying out the method of the present invention.

The apparatus illustrated in FIG. 1 for carrying out the method of the present invention is an arrangement in which anomalies can be determined on a balanced line 1 which is connected via a coupler 3 at one end 2. A pulse from a pulse generator 5 is fed to the coupler 3 via an input 4, which pulse generator 5 has a trigger pulse applied to it, from a control device 7, via a line 6. The signal S which is reflected by the line 1 to be investigated is fed via an output 8 and a downstream-connected amplifier 9 to a sampling device 10, downstream from which an analog/digital converter 11 is connected. This converter 11 is connected via a data bus 12 to the control device 7. The sample values are stored in the control device 7, preferably an electronic computer. A display device 14 is connected downstream of the control device 7, via an additional data bus 13.

In the case of a variant, which is not illustrated, of the apparatus according to FIG. 1, an analog filter 15 is connected between the amplifier 9 and the sampling device 10, which analog filter weights the signal S in accordance with the line-specific weighting function. This analog filter can, for example, be an RC element with a controllable cut-off frequency. An analog display unit can be directly connected to this filter on the output side.

When carrying out the method according to the present invention taking into account the rise times of line pulse responses in a line which is of the same type as the balanced line 1 which is to be investigated, the rise time $t_r$ of pulses reflected in such a line of the same type is initially calculated in each case as a function of the range of the assumed incorrect termination in accordance with the following general relationship $$tr = a_{tr} L^{b_{tr}} \quad (2)$$

In this equation (2), L indicates the range of the anomaly or of the fault from the one end 2a of the line 1 in meters; the variables $a_{tr}$ and $b_{tr}$ designate line-specific coefficients. In the case of a specific balanced line 1 (for example, J-Y(St)Y2×2×0.6) the rise times tr can be determined in accordance with the following equation (3):

$$tr = 0.31 \, L^{1.12} \quad (3)$$

Figure 6:
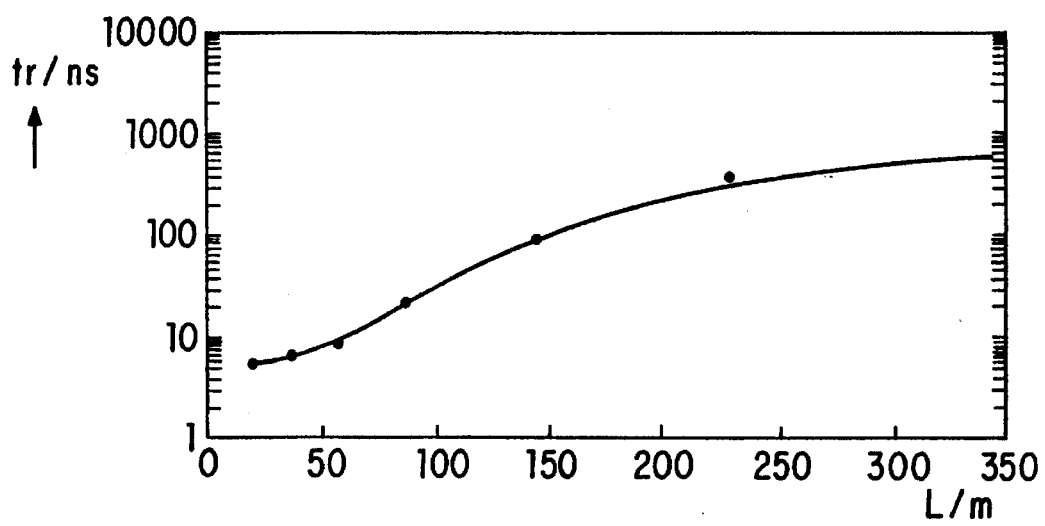
FIG. 6 depicts a diagram illustrating the dependency of the rise in the line pulse responses on the line length.

For the balanced line considered here as the line 1 to be investigated, a profile of the rise times tr of the line pulse responses is obtained in accordance with the diagram according to FIG. 6, in which the rise times tr of line pulse responses are shown in nanoseconds (ns) over the length L in meters of a line of the same type.

Figure 3A:
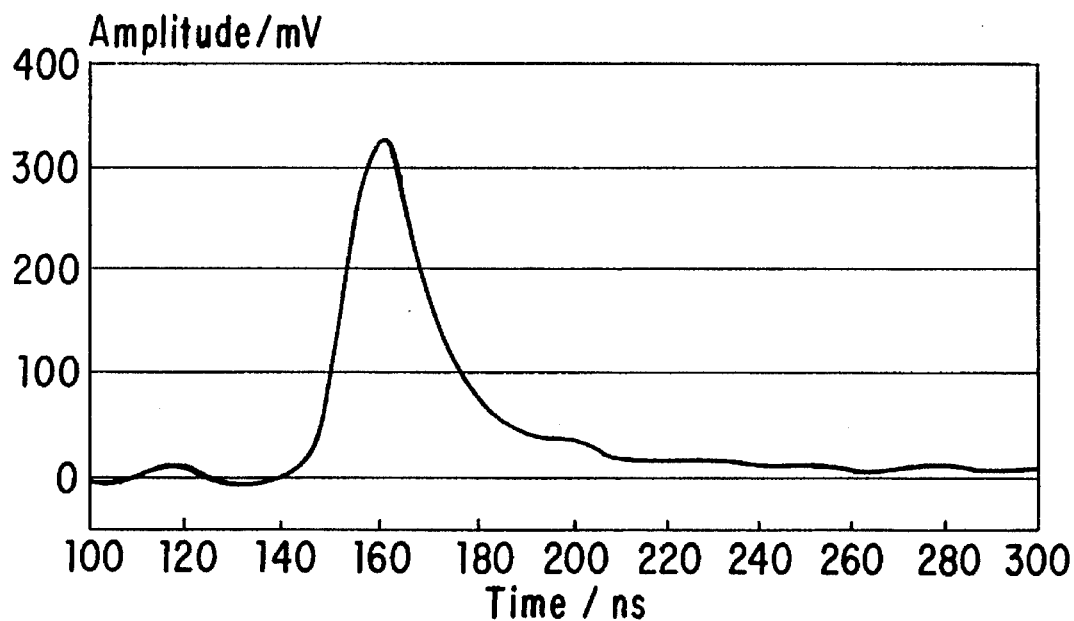
FIGS. 3A and 3B depict different reflected signals.
Figure 3B:
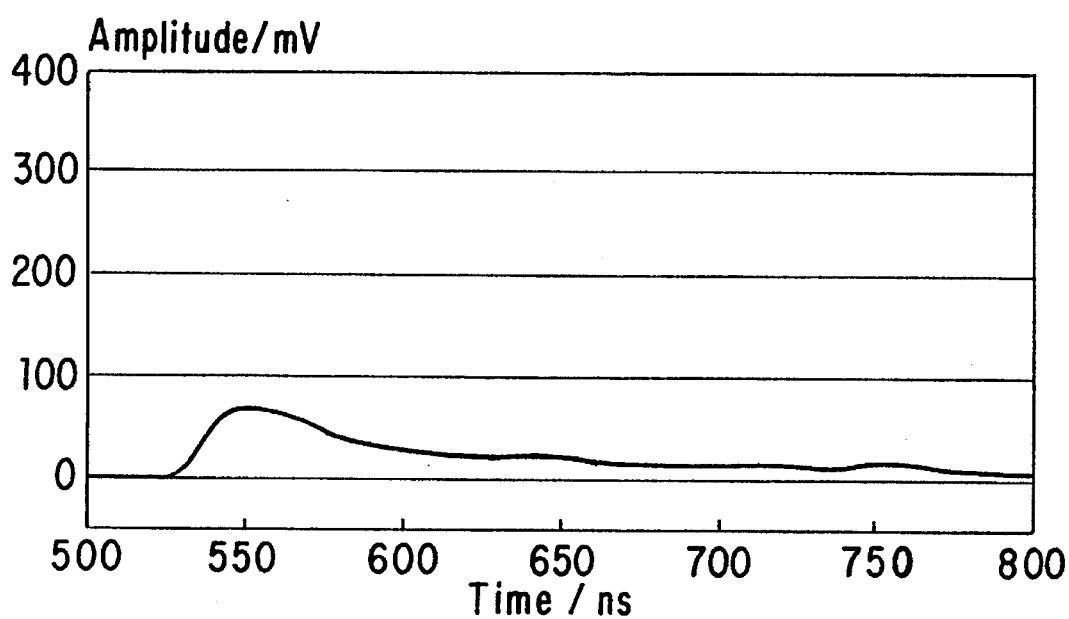

In order to illustrate the reflection behavior of the line 1 to be investigated or of a line which is of the same type as it, FIG. 3 shows pulse responses (reflected signal S) from lines of different lengths (the value is in each case mV over the time in ns). The left-hand diagram in FIG. 3 shows the pulse response in the case of a line which is open at a length of 20 m (that is to say the anomaly is at 20 m), while the right-hand diagram shows the pulse response in the case of an anomaly at a range of 60 m from the feed end.

Figure 5:
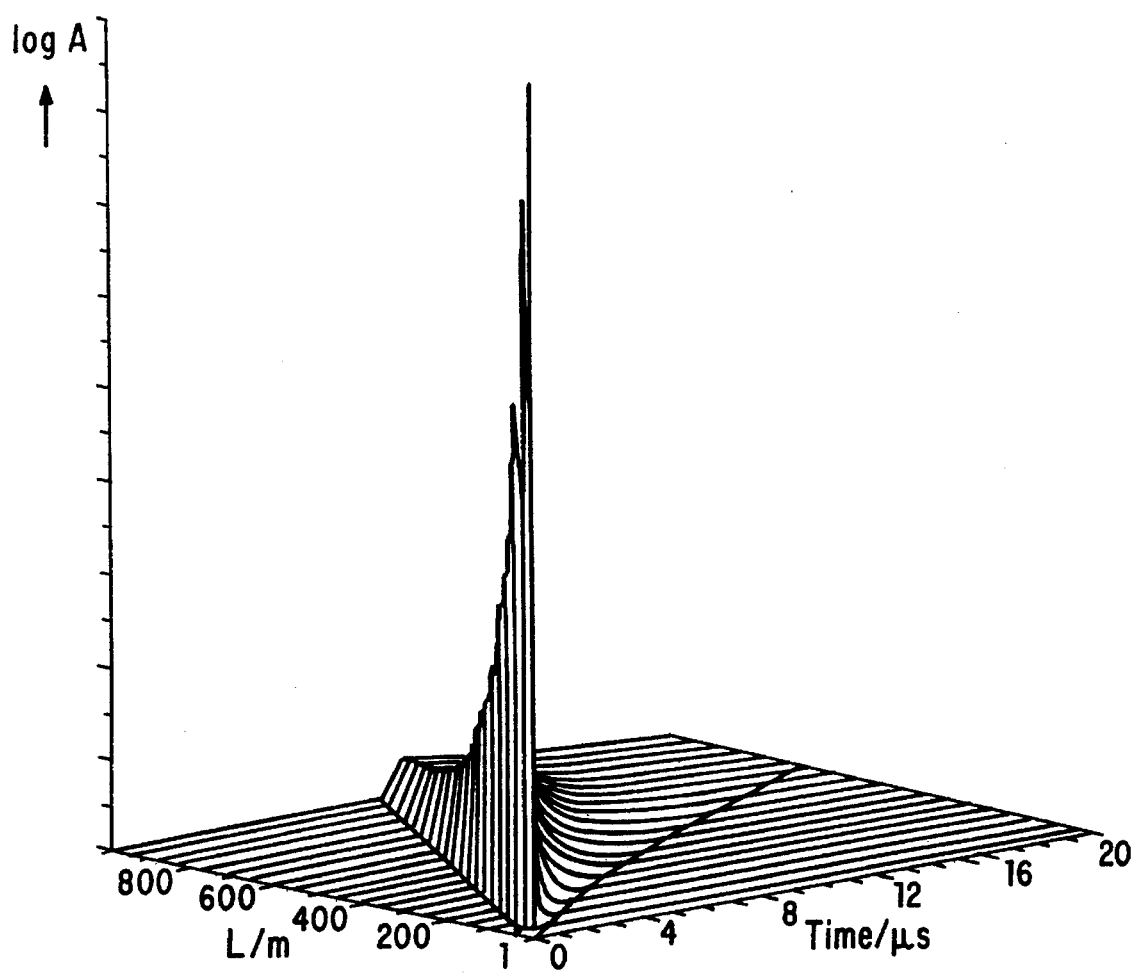
FIG. 5 depicts line pulse responses in a three-dimensional illustration.

Overall, pulse responses are obtained are as illustrated three-dimensionally in FIG. 5. FIG. 5 shows the arrival time (linearly with respect to length), pulse duration and amplitude A of the line pulse responses as a function of the length. For short lengths, the response is still similar to a dirac pulse. However, because of the dispersion, it spreads very greatly with increasing length, primarily in the falling region of the pulse response. The bandwidth limiting of the response, resulting from the low-pass filter characteristic of the line, leads to a rise which lasts longer and longer. The maximum is reached later and later in comparison with the pulse start.

Figure 2:
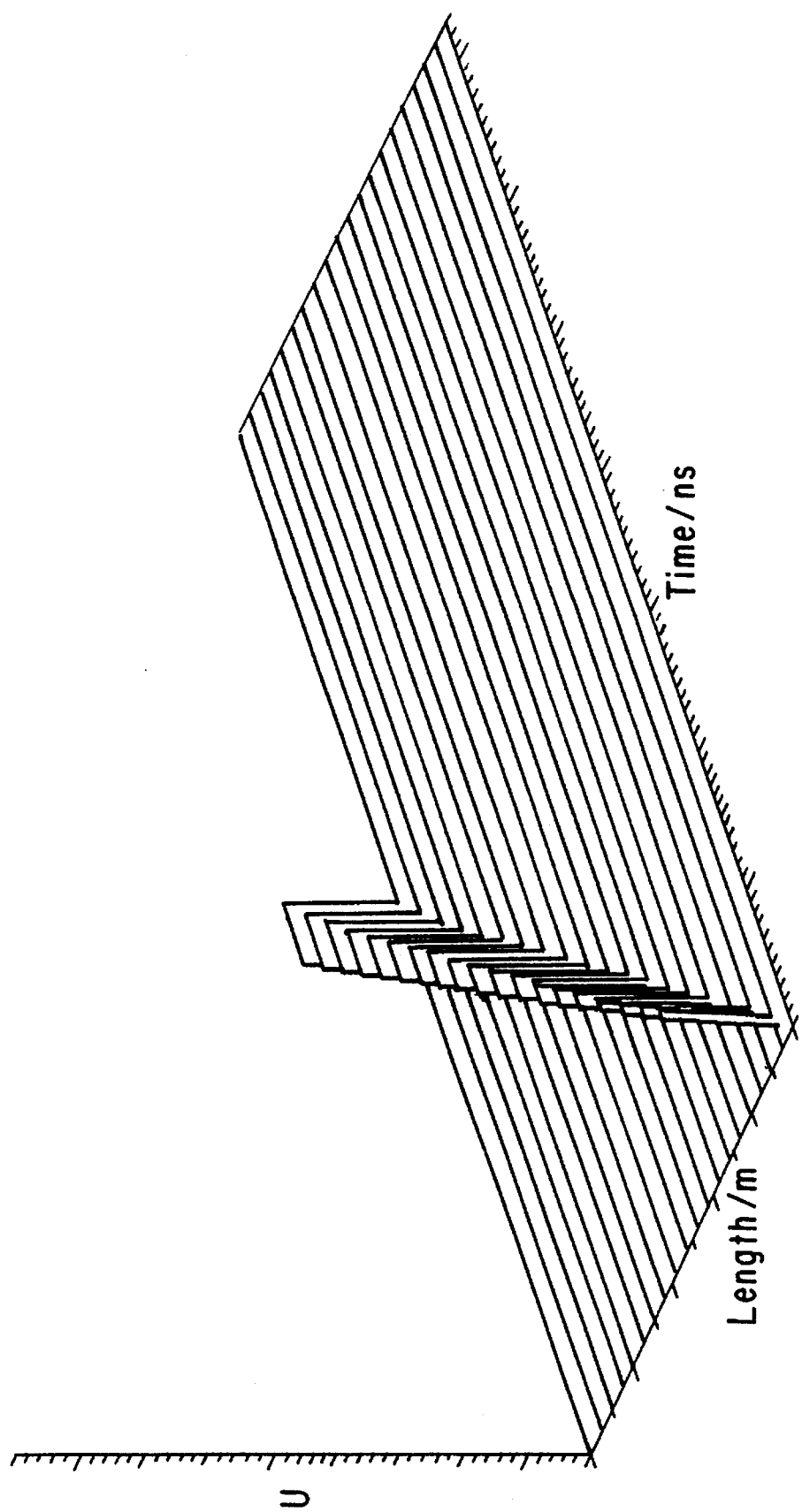
FIG. 2 depicts an advantageous weighting function for carrying out the method of the present invention.

In the case of the method according to the invention of the type described here, each stored sample value is converted by weighting into a weighted sample value $Y_i$, in accordance with the following relationship (4):

$$Y_i = \frac{1}{N_{max}} \cdot \Sigma x(i-n) \quad (4)$$

in which n=1 ... $N_{max}$ and $N_{max}$=tr; n designates a sequence index while i designates any desired sample point of the pulses (pulse response) reflected on the line 1. In consequence, equation (4) indicates that any desired sample value is weighted by those (stored) sample values which are designated by n=1 ... $N_{max}$ and precede the sampling time i being added and being divided by $N_{max}$, which represents averaging. In this case, $N_{max}$ corresponds to the rise time tr (which can be determined in accordance with equation (2)) at the time i after the pulse has been applied to the line 1 to be investigated. A weighting function is thus produced as is illustrated in FIG. 2 as a function of the length of the line 1 which is to be investigated, and of the time. It can clearly be seen that the weighting function weights a greater and greater region of the measurement series as the range of the incorrect termination from the feed point grows and the time increases. The respective weighted sample values $Y_i$ thus obtained are shown over time in the diagram C in FIG. 4.

If one considers that a profile corresponding to diagram A in FIG. 2 would be obtained without any weighting of the sample values of the signal S reflected by the line 1 which is to be investigated, then it can clearly be seen that, using the method according to the invention, weak signals can be detected considerably better in the remote region as a result of the good noise suppression. This is also true in comparison with the profile of the curve in accordance with diagram B in FIG. 2, where filtering is carried out using a normal low-pass filter.

Figure 4A:
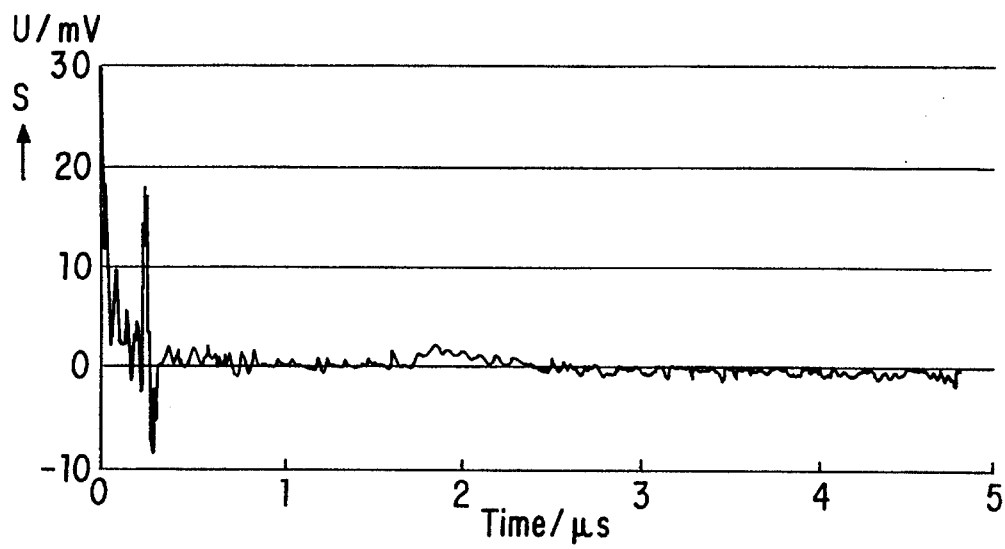
FIGS. 4A to 4C depict three diagrams in order to illustrate the noise suppression which is achieved using the method of the present invention.
Figure 4B:
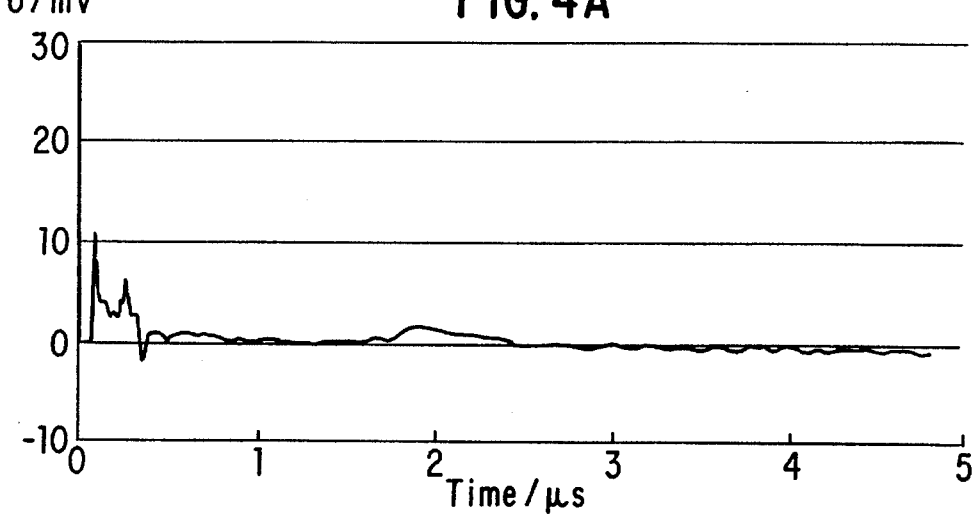
Figure 4C:
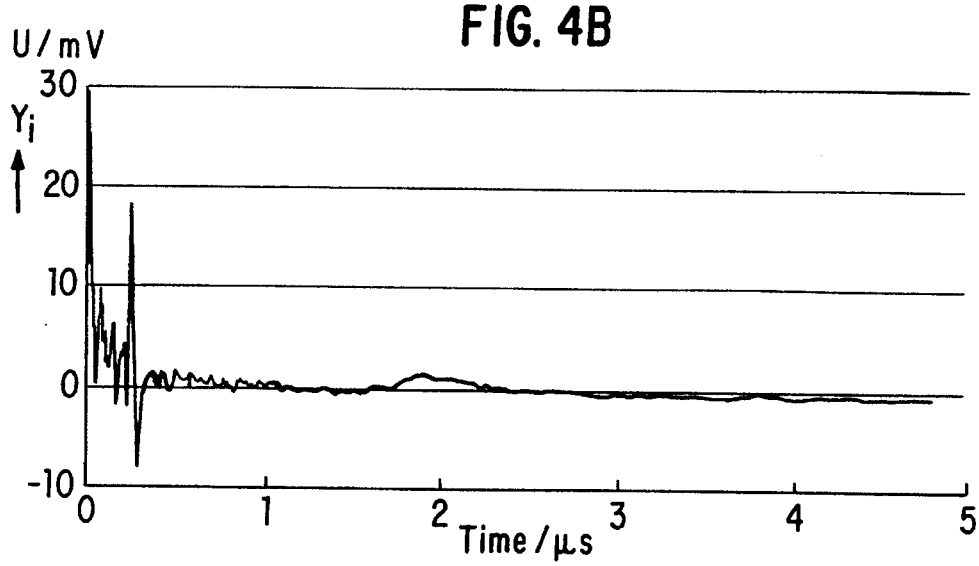

When the method according to the invention is carried out using the arrangement according to FIG. 1, the weighting function is stored in the control device 7. The convolution operations are also carried out in the computer 7, so that the weighted sample values $Y_i$ in accordance with diagram C in FIG. 4 are displayed on the downstream-connected display device 24. The anomalies in the investigated line 1 can be seen on the displayed curve profile.

I claim:

1. A method for obtaining a signal reproducing anomalies in a first line which is to be investigated, comprising the steps of:

a) forming a weighting function having a time profile which is characteristic of the reflective behavior of a line of a similar type as said line to be investigated in response to a pulse signal, said line of the same type having anomalies located at different points from said line which is to be investigated when acted upon in the form of a pulse, said weighting function being based on applying a signal in the form of a pulse to a first end of said line of the same type and detecting a first reflected signal at said first end of said line of the same type;

b) applying a single pulse to a first end of said line which is to be investigated;

c) detecting at said first end of said line which is to be investigated a second reflected signal; and d) convolving said second reflected signal in step c) with said weighting function formed in step a) to produce a signal reproducing anomalies in said line which is to be investigated.

2. The method according to claim 1, wherein the weighting of the detected, reflected signal is carried out by an analog filter, to which the signal detected in step b) is fed.

3. The method according to claim 1, further comprising the steps of:

e) sampling the signal detected in step c); and f) storing the sample values obtained in step e) as well as their time sequence relationship, wherein said weighting function produces a different weighting of the sequential sample values over a different number of sequential sample values.

4. The method according to claim 3, further comprising the step of:

g) forming weighted sample values ($Y_i$) according to the relationship:

$$Y_i = \frac{1}{N_{max}} \cdot \Sigma x(i-n)$$

wherein n=1 . . . $N_{max}$ and $N_{max}$=tr, $N_{max}$ designating a number of sample values used for the respective averaging, n designating a sequential index, x(i-n) designating unweighted sample values to be taken into account in each case, and tr designating the rise time.

5. The method according to claim 1, further comprising the steps of:

e) sampling the signal detected in step c); and f) storing the sample values obtained in step e) as well as their time sequence relationship, wherein said weighting function produces a constant weighting of the sequential sample values over a different number of sequential sample values.

6. The method according to claim 5, further comprising the step of:

g) forming weighted sample values ($Y_i$) according to the relationship:

$$Y_i = \frac{1}{N_{max}} \cdot \Sigma x(i-n)$$

wherein n=1 . . . $N_{max}$ and $N_{max}$=tr, $N_{max}$ designating a number of sample values used for the respective averaging, n designating a sequential index, x(i-n) designating unweighted sample values to be taken into account in each case, and tr designating the rise time.

7. The method according to claim 1, wherein the weighting function is formed taking into account various peak values of reflected pulses, which are produced due to anomalies located at different points in a line of a similar type.

8. The method according to claim 7, wherein the weighting of the detected, reflected signal is carried out by an analog filter, to which the signal detected in step b) is fed.

9. The method according to claim 7, further comprising the steps of:

e) sampling the signal detected in step c); and f) storing the sample values obtained in step e) as well as their time sequence relationship, wherein said weighting function produces a constant weighting of the sequential sample values over a different number of sequential sample values.

10. The method according to claim 9, further comprising the step of:

g) forming weighted sample values ($Y_i$) according to the relationship:

$$Y_i = \frac{1}{N_{max}} \cdot \Sigma x(i-n)$$

wherein n=1 . . . $N_{max}$ and $N_{max}$=tr, $N_{max}$ designating a number of sample values used for the respective averaging, n designating a sequential index, x(i-n) designating unweighted sample values to be taken into account in each case, and tr designating the rise time.

11. The method according to claim 7, further comprising the steps of:

e) sampling the signal detected in step c); and f) storing the sample values obtained in step e) as well as their time sequence relationship, wherein said weighting function produces a different weighting of the sequential sample values over a different number of sequential sample values.

12. The method according to claim 11, further comprising the step of:

g) forming weighted sample values ($Y_i$) according to the relationship:

$$Y_i = \frac{1}{N_{max}} \cdot \Sigma x(i-n)$$

wherein $n=1 \ldots N_{max}$ and $N_{max}=tr$, $N_{max}$ designating a number of sample values used for the respective averaging, n designating a sequential index, $x(i-n)$ designating unweighted sample values to be taken into account in each case, and tr designating the rise time.

13. The method according to claim 1, wherein said weighting function is formed taking into account various rise times of reflected pulses which are produced due to anomalies located at different points in a line of a similar type.

14. The method according to claim 13, wherein the weighting function is formed taking into account various peak values of reflected pulses, which are produced due to anomalies located at different points in a line of a similar type.

15. The method according to claim 13, wherein the weighting of the detected, reflected signal is carried out by an analog filter, to which the signal detected in step b) is fed.

16. The method according to claim 13, further comprising the steps of:
   e) sampling the signal detected in step c); and
   f) storing the sample values obtained in step e) as well as their time sequence relationship, wherein said weighting function produces a constant weighting of the sequential sample values over a different number of sequential sample values.

17. The method according to claim 16, further comprising the step of:
   g) forming weighted sample values ($Y_i$) according to the relationship:

$$Y_i = \frac{1}{N_{max}} \cdot \Sigma x(i-n)$$

wherein $n=1 \ldots N_{max}$ and $N_{max}=tr$, $N_{max}$ designating a number of sample values used for the respective averaging, n designating a sequential index, $x(i-n)$ designating unweighted sample values to be taken into account in each case, and tr designating the rise time.

18. The method according to claim 13, further comprising the steps of:
   e) sampling the signal detected in step c); and
   f) storing the sample values obtained in step e) as well as their time sequence relationship, wherein said weighting function produces a different weighting of the sequential sample values over a different number of sequential sample values.

19. The method according to claim 18, further comprising the step of:
   g) forming weighted sample values ($Y_i$) according to the relationship:

$$Y_i = \frac{1}{N_{max}} \cdot \Sigma x(i-n)$$

wherein $n=1 \ldots N_{max}$ and $N_{max}=tr$, $N_{max}$ designating a number of sample values used for the respective averaging, n designating a sequential index, $x(i-n)$ designating unweighted sample values to be taken into account in each case, and tr designating the rise time.

20. A device for obtaining a signal reproducing anomalies in a line which is to be investigated, comprising:
   a) a coupler being coupled to the line and applying a signal in the form of a single pulse to the line at one end and outputting a signal that is reflected in the line from said one end of the line;
   b) an amplifier having an input being coupled to the coupler and receiving the reflected signal;
   c) a sampling device having an input being coupled to the amplifier and forming samples of the reflected signal;
   d) an analog-to-digital converter having an input being coupled to the sampling device and converting the samples of the reflected signal to digital samples of the reflected signal; and
   e) a control device forming a weighting function having a time profile that is characteristic of the reflective behavior of a line of a similar type as said line in response to a pulse signal and convolving the digital samples of the reflected signal with said weighting function.

21. A method for obtaining a signal reproducing anomalies in a first line which is to be investigated, comprising the steps of:
   a) applying a signal in the form of a pulse to a first end of a second line, wherein said second line is of the same type as said first line, and wherein said second line has anomalies located at points different from said first line when acted in the form of a pulse;
   b) detecting at said first end of said second line a first reflected signal;
   c) forming a weighting function based on detected signal in step b) having a time profile which is characteristic of the reflective behavior of said first line, said second line, and any line of a same type;
   d) applying a single pulse to a first end of said first line;
   e) detecting at said first end of said first line a second reflected signal from applied signal in step d); and
   f) convolving said second reflected signal in step e) with said weighting function formed in step c) to produce a signal reproducing anomalies in said first line.

* * * * *